(12) United States Patent
DiRenzo et al.

(10) Patent No.: US 9,614,506 B1
(45) Date of Patent: Apr. 4, 2017

(54) DIGITAL PRE-COMPENSATION FOR VOLTAGE SLEWING IN A POWER CONVERTER

(71) Applicant: Texas Instruments Incorporated, Dallas, TX (US)

(72) Inventors: Michael T. DiRenzo, Coppell, TX (US); Brian A. Carpenter, Cary, NC (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/958,117

(22) Filed: Dec. 3, 2015

(51) Int. Cl.
*H02M 3/157* (2006.01)
*H03K 5/12* (2006.01)
*G05F 1/10* (2006.01)

(52) U.S. Cl.
CPC ........... *H03K 5/12* (2013.01); *G05F 1/10* (2013.01)

(58) Field of Classification Search
CPC . H02M 2001/0012; H02M 2001/0029; H02M 3/157
See application file for complete search history.

(56) References Cited

U.S. PATENT DOCUMENTS

| | | | | |
|---|---|---|---|---|
| 6,075,379 A * | 6/2000 | Haider | ........... | H03K 19/018585 326/21 |
| 6,333,654 B1 * | 12/2001 | Harris | ................ | H03K 19/0008 327/170 |
| 9,083,237 B2 * | 7/2015 | Popescu | ................ | H02M 3/156 |
| 9,236,856 B2 * | 1/2016 | Shi | ........ | H03K 17/163 |
| 2003/0025541 A1 * | 2/2003 | Humphrey | ............... | H03K 5/12 327/170 |
| 2007/0290728 A1 * | 12/2007 | Tsai | ........................ | H03K 5/12 327/170 |
| 2010/0148834 A1 * | 6/2010 | Vromans | .................. | H03C 3/04 327/170 |

OTHER PUBLICATIONS

Ni et al., Adaptive Constant On-Time (D-CAP) Control Study in Notebook Applications, Application Report SLVA281B (Texas Instruments Incorporated, 2007).

* cited by examiner

*Primary Examiner* — Gary L Laxton
(74) *Attorney, Agent, or Firm* — John R. Pessetto; Charles A. Brill; Frank D. Cimino

(57) ABSTRACT

Control logic for producing a digital input to a digital-to-analog converter (DAC) in a power converter system. The control logic selects from among a plurality of slew rates during a transition of an output voltage in response to a change in the desired setpoint, so that the output voltage transition follows a desired nominal slew rate. In an initial interval of the transition, a steeper slew rate than the nominal slew rate is selected by the control logic for the digital input to the DAC, until the digital input to the DAC exceeds the nominal slew rate by a first parameter value. At that point, a slew clamp is applied to advance the digital input at the nominal slew rate. Upon the digital input approaching the setpoint value to within a second parameter value, a flatter slew rate than nominal is applied.

21 Claims, 4 Drawing Sheets

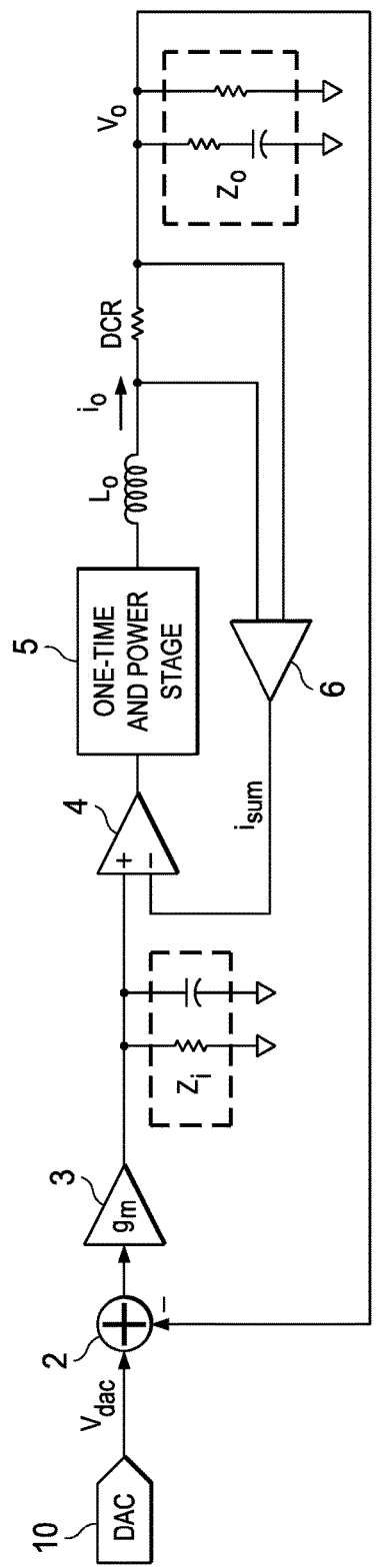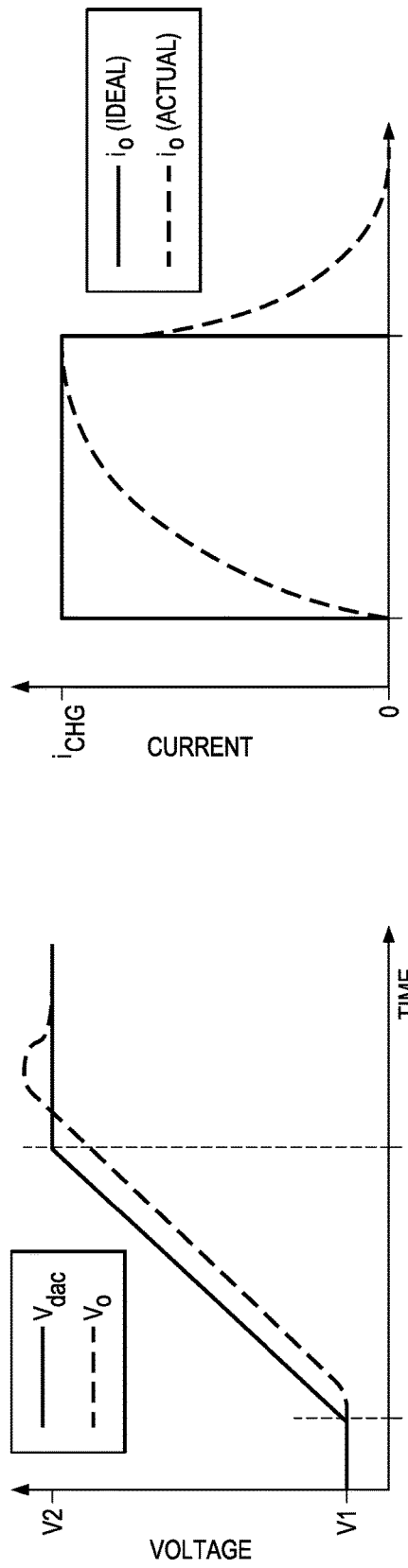
FIG. 1a (PRIOR ART)
FIG. 1b (PRIOR ART)
FIG. 1c (PRIOR ART)

DIGITAL PRE-COMPENSATION FOR VOLTAGE SLEWING IN A POWER CONVERTER

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of power management and control systems. Embodiments are more specifically directed to control of a digital-to-analog converter input to power converters and the like.

The power consumed by modern electronic systems is an increasingly important factor for a variety of reasons. One such reason is the increasing widespread use of mobile and other battery-powered systems, such as smartphones, tablet computers, wearable devices, and indeed implantable medical devices, in which conservation of battery power is important. In addition, the usable system life of many networked sensors and controllers in the so-called Internet of Things (IoT) may be limited by battery life, particularly when implemented in remote locations. Power consumption is of importance even for electronic computing systems powered from line power, for thermal considerations and also from an energy conservation standpoint.

These concerns have motivated the implementation of real-time power management systems in many modern computing and communications. Conventional power management systems produce regulated bias and power supply voltages to the integrated circuits and other functions within the system. These power management systems often include control systems for closely controlling the regulated voltages, for example by varying the voltages to be applied to particular circuit functions in response to current system conditions and operational status. One common conventional power management technique in microprocessor systems (e.g., such as in personal computers) is referred to as "Adaptive Voltage Scaling". According to this approach, a hardware performance manager circuit monitors the computational workload of the system central processing unit (CPU), and communicates that workload level to a clock management function that varies the processor clock frequency in response. For example, if the CPU workload is light, the processor clock frequency can be reduced without affecting overall system performance. According to Adaptive Voltage Scaling, the power management system adjusts power supply voltages in real-time according to the processor clock frequency or a control signal from the hardware performance manager, so that the power supply voltages applied to the relevant circuit functions are scaled with the processor clock rate to be near the minimum necessary to operate at that clock rate. Reduction of the power supply voltage of course reduces power consumption.

In real-time power management, the rapid and accurate response of power controllers to changes in the desired output voltage is desirable. However, impedances in conventional power converter systems limit this response. FIG. 1a illustrates an example of a conventional power converter system. In this system, input comparator 2 produces an error signal corresponding to the difference between output voltage $V_o$ and an analog input control signal $V_{dac}$ issued by digital-to-analog converter (DAC) 10 in response to digital data from a hardware performance manager or the like. This input control signal $V_{dac}$ indicates the desired level of output voltage $V_o$. The error signal from comparator 2 is amplified by transconductance amplifier 3, and applied to the positive input of differential amplifier 4. Impedance $Z_i$ is provided to compensate the loop for stability and to tune the performance of the system, as known in the art. The output of amplifier 4 is applied to on-time control and power stage 5, which in turn produces output voltage $V_o$. The voltage drop across the DC resistance DCR of power stage 5 is monitored via amplifier 6, which presents a signal $i_{sum}$ proportional to the output current $i_o$ of power stage 5 to the negative input of amplifier 4.

Ideally in the system of FIG. 1a, the output voltage $V_o$ would precisely and immediately follow changes in the input control signal $V_{dac}$. But propagation delays and system dynamics in actual physical systems limit the rate of change at which the voltage regulator system of FIG. 1a can respond. In the schematic diagram of FIG. 1a, these system dynamics are shown by way of analog-domain impedance $Z_i$ present at the output of amplifier 3, appearing as a resistive (DC) and capacitive (AC) coupling to system ground. At the output stage of this system, series inductance $L_o$ is driven at the output of power stage 5, at which output or load impedance $Z_o$ (e.g., appearing as parallel resistive and RC coupling to ground). This output stage adds poles, zeroes, and delay to the response of the power converter to changes in the voltage $V_{dac}$ from DAC 10.

FIGS. 1b and 1c illustrate an example of the non-ideal response of a power converter system such as that shown in FIG. 1a to the input control signal $V_{dac}$ requesting a change in output voltage $V_o$ from a voltage V1 to a voltage V2 over a time interval from time t1 to time t2. As typical in the art, this change is intended to be applied as a controlled linear increase in the input control signal $V_{dac}$ presented by DAC 10 over the slew interval, in this case at a selected slope, commonly referred to as a "slew" rate. As evident in FIG. 1b, output voltage $V_o$ lags the linear slew of input control signal $V_{dac}$, beginning with the initial transition, reaching the desired voltage level well after the desired time. FIG. 1c illustrates the corresponding response in output current $i_o$ over this slew event. Ideally for this linear slew, output current $i_o$ would be a square pulse at a desired charging current level $i_{CHG}$ over the transition interval from time t1 to time t2, as shown by plot $i_o$ (ideal) in FIG. 1c. However, the output stage inductance $L_o$ in the power converter system of FIG. 1a limits the rate of change of the output current $i_o$ for a given input voltage, as indicated by the lag between plot $i_o$ (ideal) and plot $i_o$ (actual) in FIG. 1c. At the trailing edge of the current pulse, the output stage inductance $L_o$ in the power converter system of FIG. 1a prohibits an instantaneous change in current $i_o$, and results in a lagging decay in plot $i_o$ (actual) relative to the ideal response shown by plot $i_o$ (ideal). In addition, the output or load impedance $Z_o$ delays output voltage $V_o$ from reaching the setpoint level indicated by input control signal $V_{dac}$ by the desired time t2. As shown in FIG. 1b, in some conventional systems, the lag in output current $i_o$ caused by these system dynamics can result in significant overshoot of output voltage $V_o$ beyond the desired level indicated by control signal $V_{dac}$, lengthening the settling time even further and also often resulting in additional power consumption. Of course, the response of the power converter to negative voltage transitions exhibits similar non-ideal behavior.

As mentioned above, modern electronic systems and thus the power converters and voltage regulators implemented in those systems are being asked to closely and rapidly control the delivery of power, under such control schemes as Adaptive Voltage Scaling and the like. The effects of propagation delays and system dynamics in limiting the response of conventional power management systems, as described above relative to FIGS. 1b and 1c, thus hinder the ability to achieve the power savings and efficiencies desired for many of these modern systems.

BRIEF SUMMARY OF THE INVENTION

Disclosed embodiments provide a circuit and method for altering the slew rate of a control signal to be applied by a digital-to-analog converter (DAC) to compensate for system dynamics in power management systems.

Disclosed embodiments provide such a circuit and method which may be efficiently realized in the digital control circuitry for the system.

Disclosed embodiments provide such a circuit and method that provides significant flexibility in the ability to tune the compensation.

Other objects and advantages of the disclosed embodiments will be apparent to those of ordinary skill in the art having reference to the following specification together with its drawings.

According to certain embodiments, a clocked control logic circuit is provided for producing a digital input to a DAC in response to a change in the desired setpoint of a power circuit, such as a power converter, voltage regulator, and the like. This circuit is operable to periodically advance the DAC input value at any of a plurality of slew rates comprising a nominal slew rate, a steeper-than-nominal slew rate, and a flatter-than-nominal slew rate. Initially, the DAC input value is advanced at the steeper slew rate. Upon the DAC input value exceeding the value indicated by the nominal slew rate by a first parameter value, the DAC input value advances at the nominal slew rate. Upon the DAC input value approaching the desired setpoint within a second parameter value, the DAC input value is advanced at the flatter slew rate.

BRIEF DESCRIPTION OF THE SEVERAL VIEWS OF THE DRAWING

FIG. 1a is an electrical diagram, in block and schematic form, of a conventional power converter.

FIGS. 1b and 1c are timing diagrams of the response of the conventional power converter of FIG. 1a to a change in the desired output voltage.

DETAILED DESCRIPTION OF THE INVENTION

The one or more embodiments described in this specification are implemented into digital logic circuitry involved in generating an input to a power converter or voltage regulator in a larger scale system, such as a microprocessor or microcontroller based system, as it is contemplated that such implementation is particularly advantageous in that context. However, it is also contemplated that concepts of this invention may be beneficially applied to in other applications, for example the digital control of any time-variant power level applied to a load having a significant response time. Accordingly, it is to be understood that the following description is provided by way of example only, and is not intended to limit the true scope of this invention as claimed.

Figure 2:
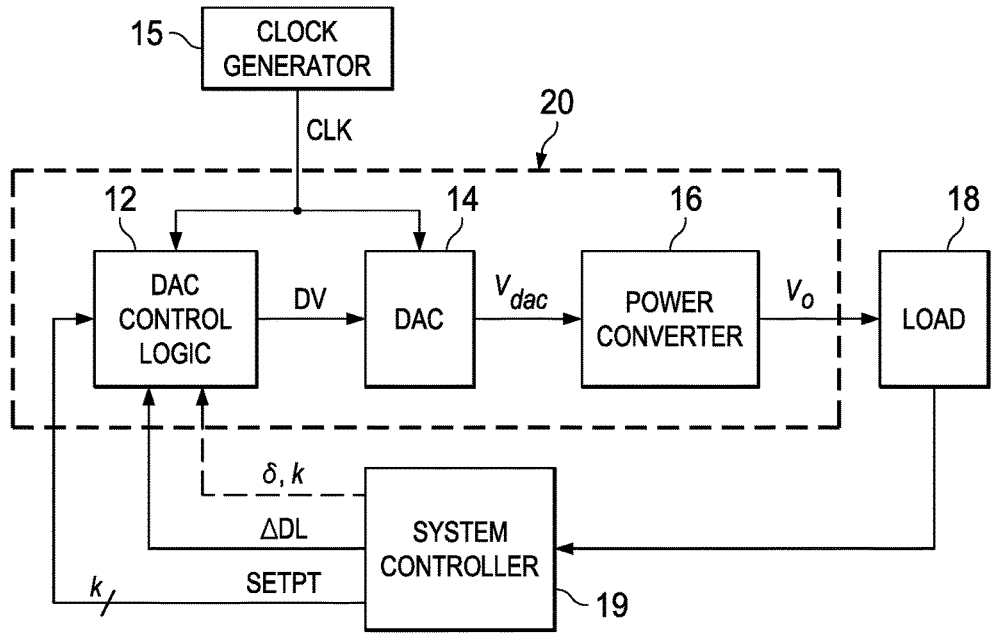
FIG. 2 is an electrical diagram, in block form, of the architecture of an electrical system including a power management system according to embodiments.

FIG. 2 illustrates the architecture of a system into which these embodiments may be implemented. In this example, these embodiments may be implemented into power management system 20, which manages the power applied to load 18. Load 18 generally refers to the end device or subsystem that is being powered, which may be a digital electronic system, an electric motor and control system, a sensor or controller in the Internet of Things (IoT) context or as a wearable or implantable device, a communications system such as a mobile telephone, and so on. As discussed above in connection with the Background of the Invention, one example of load 18 is a microprocessor-based system operating according to the well-known Adaptive Voltage Scaling technique in which the clock frequency at which the microprocessor operates is modulated according to computational demand, and in which the power supply voltage for the microprocessor modulates with modulations in the clock frequency. In any case, while the particular construction and function of load 18 may vary widely among these and other systems and subsystems, it is contemplated that load 18 presents a significant impedance to variations of its power supply and other bias voltages as discussed above relative to FIGS. 1a through 1c.

As mentioned above, power management system 20 applies voltage $V_o$ to load 18 as a power supply voltage, managing that voltage $V_o$ according to various conditions and needs. In this example, system controller 19 receives a signal from load 18, for example indicating current conditions or the results of operations carried out by load 18. In response, system controller 19 presents a digital word representing a setpoint SETPT to power management system 20. Setpoint SETPT indicates the voltage at which power management system 20 is to apply output voltage $V_o$ to load 18. In this example, system controller 19 may also present a digital signal representing a slew rate ΔDL indicating the desired slew rate at which power management system 20 is to modulate output voltage $V_o$ over time; alternatively, the slew rate at which power management system 20 changes output voltage $V_o$ may be hard-wired, stored in a configuration register of power management system 20, or otherwise defined in or communicated to power management system 20. System controller 19 may be realized by way of conventional logic circuitry for implementing an overall system control function, or alternatively may be implemented as a function of load 18 (e.g., when in the form of a microprocessor or microcontroller) itself.

As shown in FIG. 2, power management system 20 includes DAC control logic 12, which according to these embodiments receives the setpoint SETPT from system controller 19 and generates a digital DAC control signal DV to digital-to-analog converter (DAC) 14. According to these embodiments, DAC control signal DV is a time-varying signal, for example a sequence of digital sample values as described below, that indicates the desired voltage of output voltage $V_o$ at corresponding points in time. DAC control logic 12 varies DAC control signal DV over time so that output voltage $V_o$ changes from a previous voltage to the voltage indicated by setpoint SETPT, at a rate of change corresponding to slew rate ΔDL. In response, DAC 14 converts the digital value of DAC control signal DV to analog voltage $V_{dac}$ that is applied to power converter 16 of power management system 20, which in turn produces output voltage $V_o$ for application to load 18. Power converter 16 may be realized in any one of a variety of conventional arrangements of power converters and voltage regulators, for example including such control functions as an on-time control circuit, along with a power stage arranged in the form of a buck converter, boost converter, buck/boost converter, and any other power converter topology. In addition, power converter 16 may be of the single-phase type, or may alternatively be a multi-phase power converter so as to supply power to load 18 in multiple alternating phases, as known in the art.

In the embodiment of FIG. 2, DAC control logic 12 and DAC 14 in power management system 20 are realized as synchronous circuits. In this arrangement, DAC control logic 12 presents a sample value of DAC control signal DV in each cycle of a clock signal CLK generated by clock generator 15, and DAC 14 in turn modulates its analog output voltage $V_{dac}$ in response to that sample value. In this example, as will be described below in connection with a particular example, DAC control signal DV will be generated as a sequence of sample values DV[n], with the particular sample value DV[n] indicating the desired output voltage $V_o$ at clock cycle n.

In this architecture, DAC control logic 12 manages the rate of change of output voltage $V_o$ from a current value to a new value indicated by setpoint SETPT from system controller 19 according to a desired, or nominal, slew rate ΔDL. Typically, this nominal slew rate will be a linear slew rate corresponding to the desired rate of change of output voltage $V_o$. According to these embodiments, DAC control logic 12 accomplishes this operation by varying the time rate of change of DAC control signal DV from the desired or nominal slew rate ΔDL, at intervals within the transition, to compensate for the non-ideal response of power stage 16 and load 18. This compensation applied by DAC control logic 12 will enable output voltage $V_o$ to more closely follow a smooth linear or other desired slew rate in response to a change in setpoint SETPT.

Figure 3:
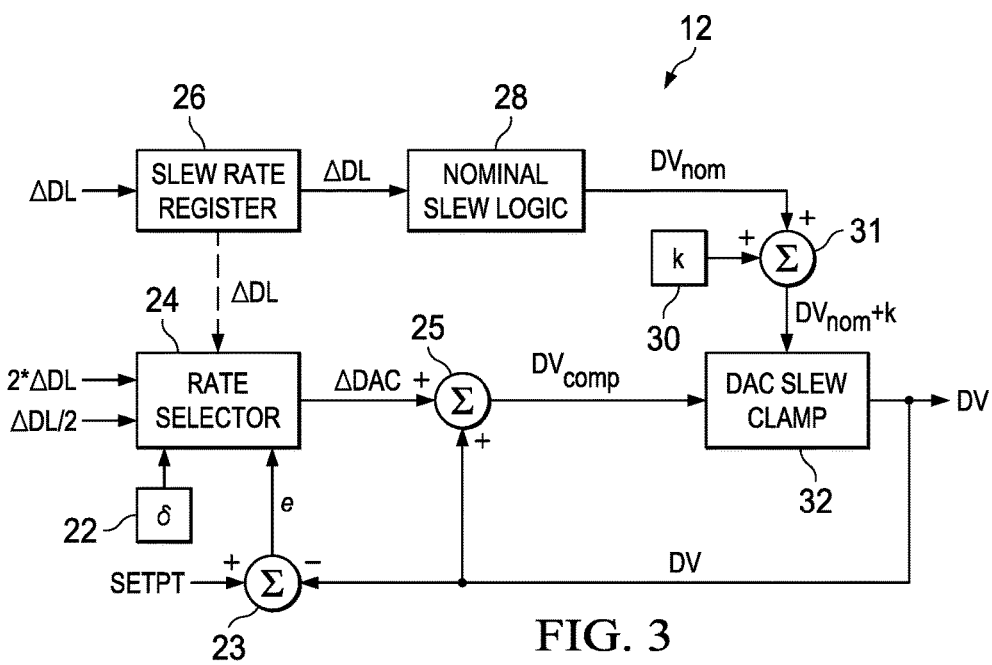
FIG. 3 is an electrical diagram, in block form, of DAC control logic in the power management system in the architecture of FIG. 2 according to an embodiment.

Referring now to FIG. 3, the architecture of DAC control logic 12 according to an embodiment will now be described. According to this embodiment, DAC control logic 12 operates to increase (or decrease) DAC control signal DV in response to an increase (or decrease) in setpoint SETPT relative to the current value of output voltage $V_o$ at varying slew rates in different intervals of the transition period. In this embodiment, the slew rates applied include a nominal slew rate, a steeper slew rate of twice the nominal slew rate, and a flatter slew rate of one-half the nominal slew rate. More specifically, as will become apparent in the following description, the steeper slew rate is applied in a first interval of the transition period, the nominal slew rate is then applied in an intermediate interval, and the flatter slew rate is applied in a final interval of the transition period.

For purposes of this description, each of the signals and stored values indicated in the architecture of DAC control logic 12 are digital signals of the appropriate data word width. DAC control signal DV output by DAC control logic 12 is of course a digital word, as it is applied to the input of DAC 14 for conversion to the analog domain.

In this embodiment, slew rate register 26 stores nominal slew rate ΔDL, as received from system controller 19 in the architecture of FIG. 2, or by being previously configured or hard-wired as such. Nominal slew rate ΔDL represents an incremental change in the value of DAC control signal DV for a given unit of time (e.g., a cycle of clock signal CLK in FIG. 2), according to a desired linear (i.e., straight-line) slew rate for the transition of output voltage $V_o$ from power controller 16. Slew rate register 26 forwards nominal slew rate ΔDL to nominal slew logic 28, which maintains and updates nominal DAC input value $DV_{nom}$. This nominal DAC input value $DV_{nom}$ represents the value of DAC control signal DV following a nominal slew rate ΔDL for the transition from its previous voltage to that represented by setpoint SETPT. As such, nominal slew logic 28 effectively operates as an accumulator, iteratively adding nominal slew rate ΔDL in each unit of time (e.g., cycle of clock signal CLK).

Nominal slew rate ΔDL is also forwarded from slew rate register 26, or is directly applied, to rate selector 24. Rate selector 24 operates to select one of a plurality of slew rates, which in this example include flatter slew rate ΔDL/2 and steeper slew rate 2*ΔDL, for use in generating DAC control signal DV. Rate selector 24 may include register locations for storing digital values representing flatter slew rate ΔDL/2 and steeper slew rate 2*ΔDL (as well as nominal slew rate ΔDL if desired). Alternatively, for the case in which available slew rates include half and double the nominal slew rate ΔDL, rate selector 24 may include shifter circuitry for producing the flatter and steeper slew rates from a one-bit right-shift and a one-bit left-shift, respectively, of the digital word representing nominal slew rate ΔDL. Selected slew rate ΔDAC that is output by slew rate selector 26 represents the incremental change in the value of DAC control signal DV for a given unit of time (e.g., a cycle of clock signal CLK in FIG. 2), according to the selected slew rate.

According to this embodiment, the slew rate of DAC control signal DV is based on two input parameters, k and δ. Parameter k represents the maximum permitted differential between a value of DAC control signal DV and the nominal DAC input value $DV_{nom}$. Parameter δ represents the differential between the value of DAC control signal DV and setpoint SETPT. These two parameters k and δ may be communicated to DAC control logic 12 by system controller 19 or from external inputs; alternatively, these parameters may be hard-wired or pre-programmed, for example by way of a configuration register or firmware resource in the system.

Parameter k is stored in register location 30, and is applied to one input of adder 31, the other input of which receives nominal DAC input value $DV_{nom}$ from nominal slew logic 28. Adder 31 produces nominal sum $DV_{nom}+k$, which represents the value of DAC control signal DV if it had followed a nominal slew rate ΔDL plus a margin corresponding to parameter k. Adder 25 receives selected slew rate ΔDAC from rate selector 24 and the current value of DAC control signal DV at its inputs, and produces incremented value $DV_{comp}$ at its output; this incremented value $DV_{comp}$ represents the value of DAC control signal DV if the increment indicated by selected slew rate ΔDAC is added to it. Both of these values are presented to DAC slew clamp 32. In operation, DAC slew clamp 32 passes incremented value $DV_{comp}$ as DAC control signal DV so long as it does not exceed (for a positive transition of output voltage $V_o$) the value of DAC control signal DV at the nominal slew rate ΔDL plus the margin k (i.e., does not exceed nominal sum $DV_{nom}+k$). In this manner, DAC slew clamp 32 "clamps" the effect of the steeper slew rate 2*ΔDL at no more than k above the nominal slew rate ΔDL.

Parameter δ affects slew rate selection. In the architecture of FIG. 3, register location 22 stores parameter δ, which is communicated to rate selector 24. Setpoint SETPT is applied to one input of subtractor 23, which receives at another input the current value of DAC control signal DV. Subtractor 23 presents error signal e corresponding to the difference of setpoint SETPT and the current value of DAC control signal DV to rate selector 24. Error signal e may take either sign, depending on whether setpoint SETPT is higher (more positive) or lower (more negative) than the current value of DAC control signal DV. According to this embodiment, rate selector 24 is constructed as logic circuitry that selects the flatter slew rate ΔDL/2 upon the absolute value of error signal e being less than the value of parameter δ. Otherwise, rate selector 24 will select the steeper slew rate 2*ΔDL in this embodiment.

Figure 4:
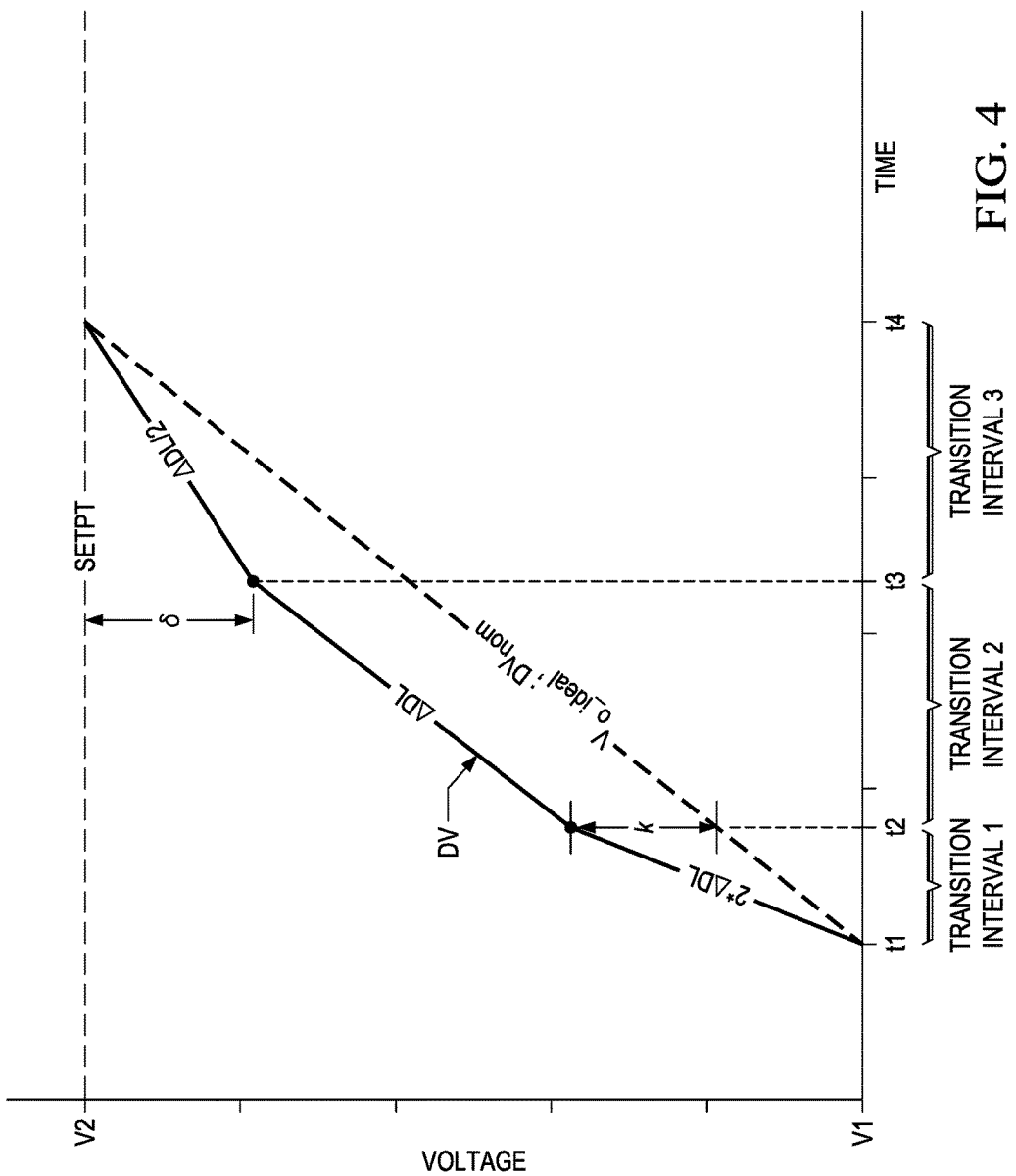
FIG. 4 is a timing diagram illustrating the operation of the DAC control logic of FIG. 3 according to that embodiment.

FIG. 4 illustrates an example of the operation of the generalized architecture of DAC control logic 12 in the case of a desired increase of output voltage $V_o$ from a current voltage V1 to a setpoint SETPT at a voltage V2, with the transition to begin at time t1 and complete at a time t4. The desired linear (i.e., straight-line) slew of output voltage $V_o$ is shown in FIG. 4 by the line $V_{o\_ideal}$. This line corresponds to nominal DAC input value $DV_{nom}$ produced by nominal slew logic 28 of FIG. 3, and has a slope at the nominal slew rate ΔDL stored in slew rate register 26. The magnitude of the voltage transition, as well as the nominal slew rate ΔDL, will vary with the type of load and power converter being used for the particular application. At time t1, error signal e from adder 23 will represent the full value of the transition and will thus exceed the value of parameter δ in this example). As a result, rate selector 24 will select steeper slew rate 2*ΔDL, which is added to current values of DAC control signal DV over time by adder 25 to produce incremented value $DV_{comp}$, which in turn is passed through by DAC slew clamp 32 as DAC control signal DV. The input to DAC 14 is thus increased at this sleeper slew rate 2*ΔDL during initial transition interval 1, shown in FIG. 4.

At such time that DAC control signal DV increases to a differential k above the nominal DAC input value $DV_{nom}$, which occurs at time t2 in the example of FIG. 4, the incremented value $DV_{comp}$ produced by adder 25 equals the nominal sum $DV_{nom}$+k from adder 31. At this point, DAC slew clamp 32 operates to clamp further increases in DAC control signal DV to the nominal sum $DV_{nom}$+k from adder 31, namely at a level k above the nominal DAC input value $DV_{nom}$. As time advances from this point, DAC control signal DV will increase with the nominal sum $DV_{nom}$+k, at the nominal slew rate ΔDL. FIG. 4 illustrates this period as transition interval 2, during which the plot of DAC control signal DV is parallel with nominal DAC input value $DV_{nom}$.

At such time that DAC control signal DV reaches to within a differential δ from setpoint SETPT, rate selector 24 operates to select the flatter slew rate ΔDL/2. In the example of FIG. 3, this occurs at time t3. After the selection by rate selector 24 of this flatter slew rate ΔDL/2 as the increment ΔDAC, the incremented value $DV_{comp}$ will fall below the nominal sum $DV_{nom}$+k, since the current value of DAC control signal DV will be increasing at a rate less than the nominal slew rate ΔDL. Accordingly, during this transition interval 3, DAC slew clamp 32 no longer clamps DAC control signal DV. DAC control signal DV increases at this flatter slew rate ΔDL/2 until reaching setpoint SETPT, at which time the transition is complete.

The control of the DAC control signal DV by DAC control logic 12 addresses the limitations in conventional linear slew systems discussed above relative to FIGS. 1a through 1c. Specifically, the more rapid initial increase in the input signal to DAC 14 tends to compensate for the lag in output voltage $V_o$ and output current $i_o$ primarily caused by the inductance $L_o$ of the output stage of the power converter. Meanwhile, the flatter increase in the input signal to DAC 14 near the end of the transition tends to reduce overshoot in the output voltage $V_o$ and decay in the output current $i_o$, caused by the inductance $L_o$ and impedance $Z_o$ in the power converter. It is therefore contemplated that the behavior of output voltage $V_o$ in response to a transition will more closely follow the desired linear slew shown in FIG. 4 by the line $V_{o\_ideal}$.

In addition, the compensation provided by DAC control logic 12 can easily be modified or tuned by way of the parameters δ and k. Trial and error tuning may be readily accomplished in those implementations in which these parameters are register locations or the like, by modifying the digital values representative of parameters δ and k. In addition, because these parameters sand k operate in a manner relative to DAC control signal DV, the ability to set the inflection points between transition intervals is closely associated with the response of the system to the transition, which facilitates the ability to compensate for system dynamics.

Figure 5:
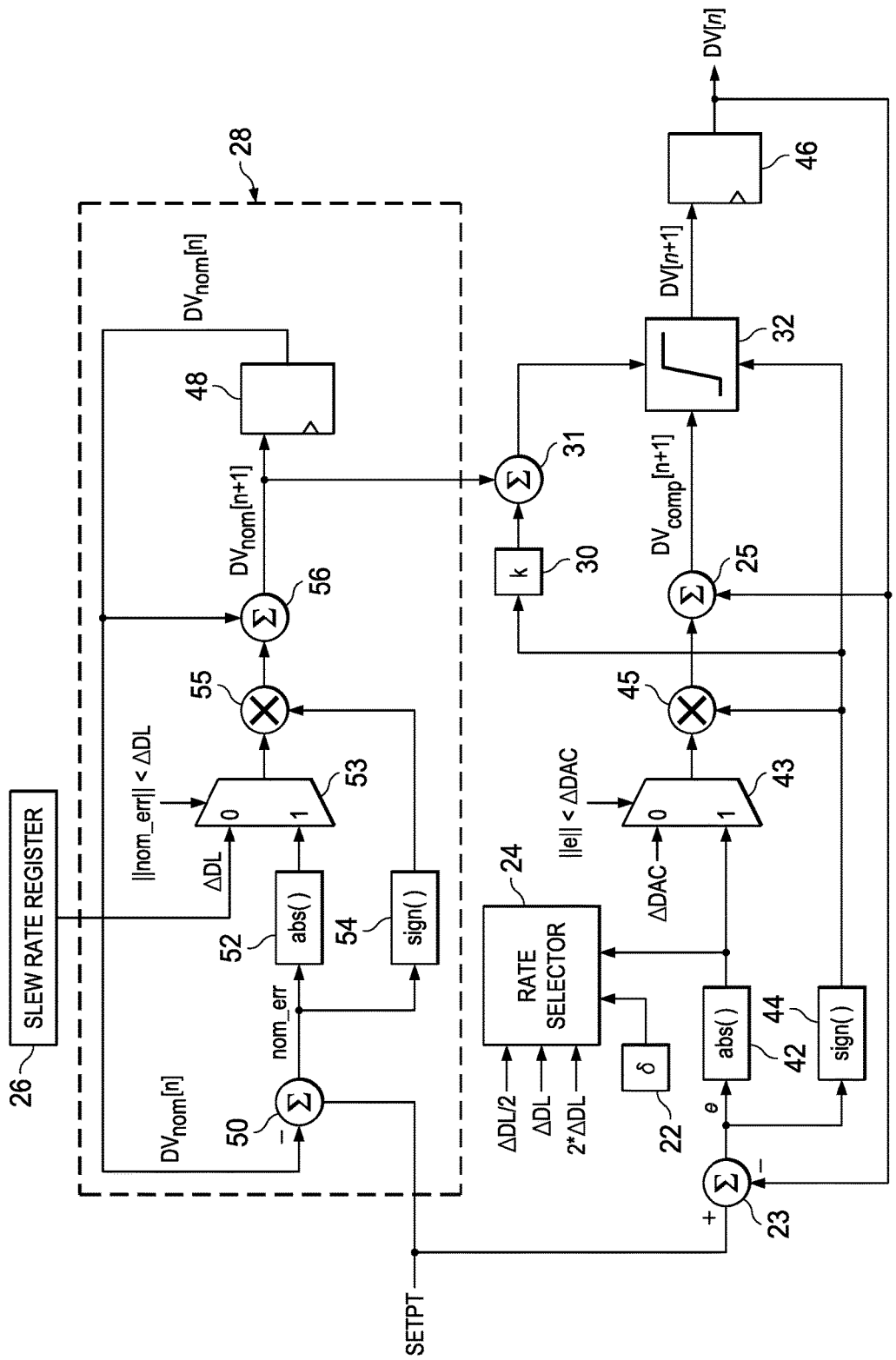
FIG. 5 is an electrical diagram, in block form, of an implementation of the DAC control logic of FIG. 3 according to an embodiment.

Referring now to FIG. 5, an embodiment of DAC control logic 12 will be described in further detail, particularly to illustrate the handling of both increases and decreases in the DAC control signal, in response to increases and decreases, respectively, in setpoint SETPT. Those circuit functions appearing in FIG. 5 that were described above relative to FIG. 3 retain the same reference numeral (e.g., rate selector 24), and will not be further described in connection with FIG. 5. In addition, while FIG. 5 illustrates this embodiment in the form of particular circuit and logic functions, it is contemplated that DAC control logic 12 may be realized in this form by custom or semi-custom logic circuitry, or alternatively by programmable logic executing a sequence of program instructions for carrying out the operations described in this specification. It is contemplated that those skilled in the art having reference to this specification will be readily able to realize these embodiments in these and a wide variety of implementations, without undue experimentation.

This embodiment is a clocked system, such that DAC control signal DV will be a sequence of sample values over time, with a current sample value expressed as DV[n] and a sample value for the next cycle expressed as DV[n+1]. As shown in FIG. 5, these data sequences signals are produced, at least in part, by latch 46 receiving the value DV[n+1] of DAC slew clamp 32 for the next sample period, while storing and presenting the current value DV[n] at its output. Latch 48 is similarly provided in nominal slew logic 28, for latching the nominal DAC input value $DV_{nom}$[n] as will be described below. These latches 46, 48 and other clocked circuitry in DAC control logic 12 of this embodiment are clocked by clock signal CLK from clock generator 15 in this example.

In this embodiment, setpoint SETPT is applied to adder 23 along with a current value DV[n] of the DAC control signal. Error signal e is applied to absolute value function 42 and sign function 44, which output the absolute value and sign information of error signal e, respectively. The absolute value of error signal e is applied to rate selector 24 and to an input of multiplexer 43. Multiplexer 43 also receives the selected slew rate increment ΔDAC from rate selector 24 at an input, and operates to select the lesser of the selected slew rate increment ΔDAC and the absolute value of error signal e toward adder 25 for use in modulating the DAC control signal DV. Multiplexer 43 thus ensures that DAC control signal DV is not unintentionally increased above setpoint SETPT as it approaches the setpoint SETPT voltage.

The selected value from multiplexer 43 is then multiplied by the sign of error signal e by multiplier 45, and then applied to adder 25 to generate incremented value $DV_{comp}[n+1]$ for the next cycle. Multiplier 45 thus presents a negative increment to adder 25 if setpoint SETPT is less than (more negative) the current value DV[n] of the DAC control signal, and a positive increment if setpoint SETPT is greater (more positive). Adder 25 then produces incremented value $DV_{comp}[n+1]$ from the addends of the DAC control signal current value DV[n] and the signed increment according to the selected slew rate or error signal e, as the case may be. This incremented value $DV_{comp}[n+1]$ is applied to DAC slew clamp 32 as described above relative to FIG. 3.

Nominal slew logic 28 is arranged and operates in an analogous fashion as the data path generating incremented value $DV_{comp}[n+1]$. As such, nominal slew logic 28 receives setpoint SETPT at one input of its subtractor 50. Subtractor 50 subtracts the current linear input value $DV_{nom}[n+1]$ from the output of latch 48 from setpoint SETPT, to produce difference nom_err that represents the difference between the value of the DAC control signal if it were to follow the linear slope and setpoint SETPT, analogously to subtractor 23. Difference nom_err is applied to absolute value function 52 and sign function 54, with the absolute value of difference nom_err applied to one input of multiplexer 53; another input of multiplexer 53 receives nominal slew rate ΔDL from slew rate register 26. Analogously with multiplexer 43, multiplexer 53 selects the lesser of the increment indicated by nominal slew rate ΔDL and the absolute value of difference nom_err for application to multiplier 55, for multiplication with the sign of difference nom_err. The value at the output of multiplier 55 is added to the current linear input value $DV_{nom}[n+1]$ by adder 56, to become the next linear input value $DV_{nom}[n+1]$. This next linear input value $DV_{nom}[n+1]$ is applied to the data input of latch 48 to be stored on the next edge of clock signal CLK, and is also applied to adder 31.

The sign of error signal e as determined by sign function 44 multiplies the value of parameter k stored in register location 30, and that signed value of parameter k is applied to adder 31 for addition with next linear input value $DV_{nom}[n+1]$. For a positive transition of output voltage $V_o$, parameter k will have a positive sign, and thus the sum ($DV_{nom}[n+1]+k$) applied to DAC slew clamp 32 will be a voltage that is k above the linear slew value. Conversely, parameter k will have a negative sign for a negative transition of output voltage $V_o$, in which case the sum ($DV_{nom}[n+1]+k$) applied to DAC slew clamp 32 will be a voltage that is k below (more negative than) the linear slew value. The sign of error signal e is also directly forwarded to DAC slew clamp 32, so that the comparison between the incremented value $DV_{comp}[n+1]$ and the sum ($DV_{nom}[n+1]+k$) will take the polarity of the transition into account. DAC slew clamp 32 will produce the next value of DAC control signal DV[n+1] accordingly, which is applied to the data input of latch 46 and will be stored on the next edge of clock signal CLK.

Various alternatives and variations to these embodiments are contemplated. Referring back to FIG. 2 and as mentioned above, it is contemplated that system controller 19 or other programmable logic circuitry (including, for example, a microprocessor serving as load 18) may communicate parameters k and δ to DAC control logic 12. According to one alternative implementation, programmable logic such as system controller 19 may calculate parameters k and δ as a function of nominal slew rate ΔDL, for example so that parameters k and δ have higher values in response to selection of a steeper nominal slew rate ΔDL and have lower values in response to selection of a flatter nominal slew rate ΔDL. Other relationships between the values of parameters k and δ and nominal slew rate ΔDL may similarly be implemented according to this approach. In this way, additional pre-compensation can be implemented when appropriate for more difficult slew situations, and backed off in less extreme cases to more closely follow the desired nominal slew rate over the transition interval.

Further in the alternative, it is contemplated that closed-loop control of the values of parameters k and δ based on the behavior of output voltage $V_o$ in response to changes in the setpoint SETPT may be implemented. In this approach, sensing circuitry may be provided at the output of power converter 20 or at load 18 to sense output voltage $V_o$, output current $i_o$, or both, and to communicate corresponding feedback signals to programmable logic such as system controller 19. This programmable logic can then process data corresponding to the feedback signals to detect overshoot and undershoot of output voltage $V_o$ or output current $i_o$ during previous transitions, and to adjust the values of parameters k and δ accordingly.

Furthermore, while the embodiments described above operate to apply different slew rates over three intervals of the transition, it is contemplated that the number of intervals may vary from these examples, for example including more than three intervals with additional inflection points during the transition. Furthermore, it is contemplated that the various slew rates may be second or higher order slew rates, or linear slew rates other than the double and half rates described above. Still further in the alternative, it is contemplated that portions of the circuitry for determining the DAC control signal may be performed in the analog domain, if desired.

According to these embodiments, circuitry and a corresponding method of controlling the slew rate of the input to a power converter so as to pre-compensate for the response and other system dynamics of the power converter system are provided. As a result, it is contemplated that the pre-compensation provided by these embodiments can enable the rapid response of the power converter system, and thus the maximization of system performance in minimizing power consumption. These embodiments provide such circuitry and operation in a manner that can be efficiently realized in modern control systems, and that does not inject significant delay into the control of the system. In addition, these embodiments allow for fine tuning of the control loop by way of parameters that can be easily modified.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of generating a digital control signal for controlling an electronic power management function, comprising the steps of:
   receiving an input indicating a setpoint differing from a current value of the digital control signal;

initially advancing the digital control signal toward the setpoint at a first slew rate steeper than a nominal slew rate;

responsive to the digital control signal exceeding a nominal value corresponding to a nominal slew rate value by a difference greater than a first parameter value, then advancing the digital control signal toward the setpoint at the nominal slew rate; and responsive to the digital control signal differing from the setpoint by a difference less than a second parameter value, then advancing the digital control signal toward the setpoint at a second slew rate flatter than the nominal slew rate.

2. The method of claim 1, wherein the setpoint corresponds to a first setpoint value more positive than the current value of the digital control signal;

and wherein each of the advancing steps increases the digital control signal.

3. The method of claim 1, wherein the setpoint corresponds to a second setpoint value more negative than the current value of the digital control signal;

and wherein each of the advancing steps decreases the digital control signal.

4. The method of claim 1, wherein each of the advancing steps is performed periodically at a clock rate, and comprises:

in each clock period, adding an increment corresponding to a selected slew rate to the digital control signal in a previous clock period to produce an incremented value; and applying the incremented value as the digital control signal for the next clock period.

5. The method of claim 1, wherein each of the advancing steps is performed periodically at a clock rate;

and wherein the step of advancing the digital control signal at the first slew rate comprises:

in a clock period, adding an increment corresponding to the first slew rate to the value digital control signal in a previous clock period to produce an incremented value; and applying the incremented value as the digital control signal for a next clock period.

6. The method of claim 5, further comprising:

in the clock period, advancing a linear value at the nominal slew rate; and in the clock period, adding the first parameter value to the linear value to produce a nominal sum;

and wherein the step of advancing the digital control signal at the nominal slew rate comprises:

responsive to the incremented value differing from the nominal sum by more than the first parameter value, applying the incremented value as the digital control signal for the next clock period; and responsive to the incremented value differing from the nominal sum by less than the first parameter value, applying the nominal sum as the digital control signal for the next clock period.

7. The method of claim 1, wherein each of the advancing steps is performed periodically at a clock rate;

and wherein the advancing the digital control signal at the second slew rate comprises:

in a clock period, adding an increment corresponding to the second slew rate to the digital control signal in a previous clock period to produce an incremented value; and applying the incremented value as the digital control signal for a current clock period.

8. The method of claim 1, wherein the first slew rate is twice the nominal slew rate.

9. The method of claim 1, wherein the second slew rate is one-half the nominal slew rate.

10. The method of claim 1, further comprising:

determining the first and second parameter values responsive to the nominal slew rate.

11. The method of claim 1, further comprising:

sensing, over a time interval, an output response of the power management function to a change in the setpoint; and determining the first and second parameter values responsive to the sensed response.

12. A power converter system, comprising:

a power converter, for producing an output voltage;

a digital-to-analog converter (DAC) for receiving a DAC control signal and applying an input control signal to the power converter to control the output voltage of the power converter; and DAC control logic for generating the DAC control signal responsive to a setpoint, comprising:

nominal slew logic, for producing a nominal DAC input value corresponding to a nominal slew rate;

a rate selector selecting among a plurality of slew rates comprising a first slew rate steeper than the nominal slew rate and a second slew rate flatter than a nominal slew rate;

a first adder, for adding a previous value of the DAC control signal to an increment corresponding to a slew rate selected by the rate selector, to produce an incremented value;

a clamp circuit, for generating the DAC control signal corresponding to the nominal DAC input value responsive to the incremented value exceeding the nominal DAC input value by a difference corresponding to a first parameter value; and a first subtractor producing an error signal corresponding to a difference between the setpoint and a previous value of the DAC control signal;

wherein the rate selector selects the first slew rate responsive to the error signal exceeding a second parameter value, and selects the second slew rate responsive to the error signal being less than the second parameter value.

13. The system of claim 12, wherein the DAC control logic further comprises:

a slew rate register storing a nominal increment corresponding to the nominal slew rate;

wherein the nominal slew logic comprises:

a first latch, clocked by a clock signal, for storing a previous value of the nominal DAC input value;

a second adder, coupled to an output of the first latch, for adding the nominal increment to the previous value of the nominal DAC input value stored in the first latch, to produce a next value of the nominal DAC input value;

and wherein the DAC control logic further comprises:

a third adder for adding the next value of the nominal DAC input value to the first parameter value.

14. The system of claim 13, wherein the DAC control logic further comprises:

a second latch, clocked by the clock signal, for storing a previous value of the DAC input value;

wherein the first adder and the first subtractor are each coupled to an output of the second latch to receive the previous value of the DAC input value.

15. The system of claim 14, wherein the DAC control logic further comprises:

a first selector, having an input receiving a first increment corresponding to the selected slew rate selected and an input receiving the error signal, and an output coupled to the first adder, the first selector controlled to select a second increment corresponding to the selected slew rate responsive to the error signal having a greater magnitude than the first increment, and to select the error signal responsive to the error signal having a lesser magnitude than the first increment.

16. The system of claim 15, wherein the nominal slew logic further comprises:
   a second subtractor producing a nominal error corresponding to a difference between the setpoint and the previous value of the nominal DAC input value stored in the first latch;
   a second selector, having an input receiving a nominal increment and an input receiving the nominal error, and an output coupled to the second adder, the second selector controlled to select the nominal increment responsive to the nominal error having a greater magnitude than the nominal increment, and to select the nominal error responsive to the nominal error signal having a lesser magnitude than the nominal increment.

17. The system of claim 12, wherein the DAC control logic further comprises:
   a first register location storing the first parameter value; and
   a second register location storing the second parameter value.

18. The system of claim 12, wherein the first slew rate is twice the nominal slew rate.

19. The system of claim 12, wherein the second slew rate is one-half the nominal slew rate.

20. The system of claim 12, further comprising:
   programmable logic, coupled to the DAC control logic, for determining the first and second parameter values responsive to the nominal slew rate.

21. The system of claim 12, further comprising:
   sensing circuitry for sensing the output voltage of the power converter overtime; and
   programmable logic, coupled to the sensing circuitry, for determining the first and second parameter values responsive to response of the output voltage to a change in the setpoint.

* * * * *